United States Patent
Kiep et al.

(10) Patent No.: US 9,871,126 B2
(45) Date of Patent: Jan. 16, 2018

(54) DISCRETE SEMICONDUCTOR TRANSISTOR

(71) Applicant: Infineon Technologies AG, Neubiberg (DE)

(72) Inventors: Andreas Kiep, Munich (DE); Stefan Willkofer, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/305,596

(22) Filed: Jun. 16, 2014

(65) Prior Publication Data
US 2015/0364468 A1   Dec. 17, 2015

(51) Int. Cl.
  *H01L 27/082* (2006.01)
  *H01L 29/739* (2006.01)
  *H01C 7/04* (2006.01)
  *H01L 27/06* (2006.01)
  *H01L 49/02* (2006.01)

(52) U.S. Cl.
  CPC ........... *H01L 29/7395* (2013.01); *H01C 7/04* (2013.01); *H01L 27/0629* (2013.01); *H01L 28/20* (2013.01)

(58) Field of Classification Search
  CPC .... H01C 7/006; H01C 7/0042; H01C 17/075; H01C 17/08; H01C 17/12; H01C 17/16; H01C 17/18; H01L 28/20
  See application file for complete search history.

(56) References Cited

U.S. PATENT DOCUMENTS

| | | | | | |
|---|---|---|---|---|---|
| 3,707,874 | A | * | 1/1973 | Tuttle | G01P 5/12 374/210 |
| 5,008,725 | A | * | 4/1991 | Lidow | H01L 29/1095 257/341 |
| 5,408,128 | A | * | 4/1995 | Furnival | H01L 23/49811 257/690 |
| 5,592,006 | A | * | 1/1997 | Merrill | H01L 29/435 257/140 |
| 5,633,036 | A | * | 5/1997 | Seebauer | C23C 16/04 204/192.25 |
| 5,684,323 | A | * | 11/1997 | Tohyama | H01L 27/0248 257/363 |
| 5,731,604 | A | * | 3/1998 | Kinzer | H01L 29/1095 257/153 |

(Continued)

FOREIGN PATENT DOCUMENTS

WO   WO 2013/099668   *   7/2013   ............... H01C 7/00

OTHER PUBLICATIONS

J.E. Suarez et al., Thermal Stability of Polysilicon Resistors, Jun. 1992, IEEE Transactions on Components, Hybrids, and Manufacturing Technology, vol. 15, No. 3, pp. 386-392.*

(Continued)

*Primary Examiner* — Victoria K Hall
(74) *Attorney, Agent, or Firm* — Murphy, Bilak & Homiller, PLLC

(57) ABSTRACT

A discrete semiconductor transistor includes a gate resistor electrically coupled between a gate electrode terminal and a gate electrode of the discrete semiconductor transistor. A resistance R of the gate resistor at a temperature of −40° C. is greater than at the temperature of 150° C.

16 Claims, 4 Drawing Sheets

(56) References Cited

U.S. PATENT DOCUMENTS

| | | | | |
|---|---|---|---|---|
| 6,008,533 | A * | 12/1999 | Bruce | H01L 23/49531 257/664 |
| 6,023,086 | A * | 2/2000 | Reyes | H01L 23/4824 257/287 |
| 6,245,627 | B1 * | 6/2001 | Chen et al. | 438/382 |
| 7,327,186 | B1 * | 2/2008 | Wadhwa | G05F 3/16 327/538 |
| 7,580,299 | B2 * | 8/2009 | Kim | G11C 5/147 327/539 |
| 9,054,072 | B2 * | 6/2015 | Yamamoto | H01L 23/49551 |
| 9,530,546 | B2 * | 12/2016 | Nukaga | H01C 7/00 |
| 2001/0002782 | A1 * | 6/2001 | Shimane | B60L 11/1803 318/282 |
| 2001/0019137 | A1 * | 9/2001 | Koga | H01L 21/28273 257/104 |
| 2001/0025963 | A1 * | 10/2001 | Tashiro | H01L 21/84 257/173 |
| 2002/0013048 | A1 * | 1/2002 | Macheel | H01L 24/49 438/650 |
| 2004/0014275 | A1 * | 1/2004 | Hasegawa | H01L 27/0629 438/227 |
| 2005/0133855 | A1 * | 6/2005 | Graf | 257/327 |
| 2005/0194635 | A1 * | 9/2005 | Pfirsch | 257/329 |
| 2006/0022298 | A1 * | 2/2006 | Shiraishi | H01L 23/3107 257/509 |
| 2006/0081878 | A1 * | 4/2006 | Makihara | H03F 1/302 257/197 |
| 2008/0054369 | A1 * | 3/2008 | Schulze | H01L 29/0834 257/378 |
| 2008/0174525 | A1 * | 7/2008 | Ito | G09G 3/296 345/63 |
| 2009/0322417 | A1 * | 12/2009 | Hirler | H01L 29/407 327/543 |
| 2011/0241020 | A1 | 10/2011 | Saunier | |
| 2013/0221315 | A1 * | 8/2013 | Wang | H01L 45/08 257/4 |
| 2015/0333168 | A1 * | 11/2015 | Hirler | H01L 29/0615 257/329 |
| 2016/0111867 | A1 * | 4/2016 | Bousquet | H02H 3/08 361/101 |
| 2017/0200795 | A1 * | 7/2017 | Koepp | H01L 29/41725 |

OTHER PUBLICATIONS

D.H. Navon, Technique for Thermal Stabilization of Transistors, Oct. 1973, IEEE Transactions on Electron Devices, pp. 907-909.*

W.A. Lane & G.T. Wrixon, The Design of Thin-Film Polysilicon Resistors for Analog IC Applications, Apr. 1989, IEEE Transactions on Electron Devices, vol. 36, No. 4, pp. 738-744.*

JEDEC, Terms, Definitions, and Letter Symbols for Discrete Semiconductor and Optoelectronic Devices, JEDEC Standard 77-B (JESD77-B), Feb. 2000, p. 2-4.*

* cited by examiner

DISCRETE SEMICONDUCTOR TRANSISTOR

BACKGROUND

Semiconductor devices, in particular field-effect controlled switching devices such as a junction field effect transistor (JFET), a metal oxide semiconductor field effect transistor (MOSFET) and an insulated gate bipolar transistor (IGBT) are typically used for various applications including but not limited to switches in power supplies and power converters, electric cars, air-conditioners, and inverters in motor drives.

When switching off transistors, switching losses and an overvoltage typically occur between first and second load terminals such as drain and source of an FET or collector and emitter of an IGBT. Since one characteristic of transistors is a specified breakdown voltage Vbr between the first and second load terminals, a goal of transistor design is to avoid electric breakdown caused by overvoltages during turn-off operation over a specified operation temperature range.

Accordingly, there is a need to improve a voltage margin between the specified breakdown voltage Vbr and overvoltages occurring during turn-off operation over a specified operation temperature range without deteriorating switching losses.

SUMMARY

An embodiment refers to a discrete semiconductor transistor. The discrete semiconductor transistor comprises a gate resistor electrically coupled between a gate terminal and a gate electrode of the discrete semiconductor transistor. A resistance R of the gate resistor at a temperature of −40° C. is greater than at the temperature of 150° C.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1:
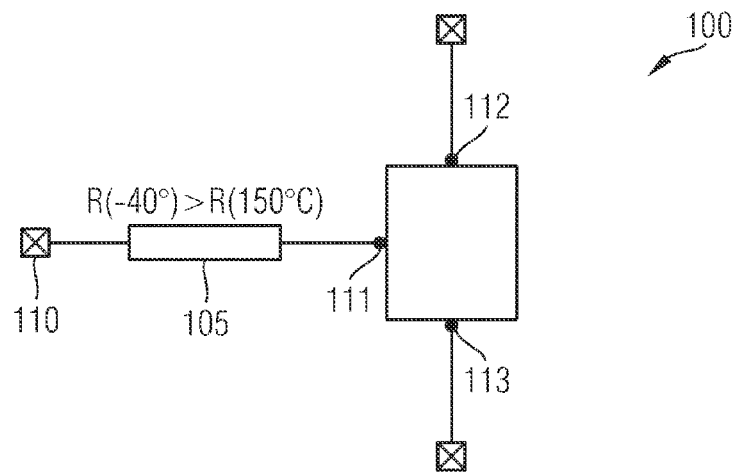
FIG. 1 is a schematic illustration of an embodiment of a discrete semiconductor transistor comprising a gate resistor with a negative temperature coefficient.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The description of the embodiments is not limiting. In particular, elements of the embodiments described hereinafter may be combined with elements of different embodiments.

The terms "wafer", "substrate", "semiconductor body" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, to semiconductor devices, in particular to field effect semiconductor transistors. Within this specification the terms "semiconductor device" and "semiconductor component" are used synonymously. The semiconductor device typically includes a field-effect structure. The field-effect structure may be a MOSFET or an IGBT-structure having a pn-junction forming a body diode between a drift region of the first conductivity type and a body region of the second conductivity type. The semiconductor device is typically a vertical semiconductor device having two load metallizations, for example a source metallization and a drain metallization for a MOSFET, which are arranged opposite to each other and in low resistive contact with a respective contact region. The field-effect structure may also be formed by a JFET-structure.

By way of example, the semiconductor device is a power semiconductor device having an active area with, for example, a plurality of IGBT-cells or MOSFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the 10 Ampere to a few kA range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure, the channel region is typically formed by a portion of the drift region of the first conductivity type arranged between a gate region and a body region of the second conductivity type, and may be controlled by changing the width of a depletion layer formed between the gate region and the channel region.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

By way of example, the gate electrode is implemented as trench-gate electrode, i.e. as a gate electrode which is arranged in a trench extending from the main surface into the semiconductor substrate or body. The gate electrode may also be implemented as a planar gate electrode.

A unit cell of an active area of a power field-effect semiconductor device may, in a horizontal cross-section, include a trench-gate electrode and a surrounding portion of a mesa when the trench-gate electrodes form a two-dimensional lattice, for example in the form of a checker board, when seen from above.

Alternatively, the unit cell of the active area of a power field-effect semiconductor device may, in a horizontal cross-section, include a trench-gate electrode and a respective portion of two adjoining mesas when seen from above. In these embodiments, trench-gate electrodes, mesas and unit cells may form respective one-dimensional lattices.

The conductive regions for forming the gate electrode and the field electrode, respectively, may be made of a material with high enough electric conductivity so that the conductive region forms an equipotential region during device operation. For example, the conductive region may be made of a material with metallic or near-metallic electric conductivity such as a metal, for example tungsten, highly doped poly-silicon, a silicide or the like. Typically, the conductive region is in resistive electric connection with a gate metallization of the semiconductor device. The insulating region may be made of any suitable dielectric material such as silicon oxide, for example thermal silicon oxide, silicon nitride, siliconoxynitride or the like.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as TaSi2, TiSi2, PtSi, CoSi2, WSi2 or the like. The metallization may also include different electrically conductive materials, for example a stack of those materials.

FIG. 1 is a schematic illustration of an embodiment of a discrete semiconductor transistor 100.

The discrete semiconductor transistor 100 comprises a gate resistor 105 electrically coupled between a gate terminal 110 and a gate electrode terminal 111 of the discrete semiconductor transistor 100. A resistance R of the gate resistor 105 at a temperature of −40° C. is greater than at the temperature of 150° C., i.e. R(−40° C.)>R(150° C.). Other than an integrated circuit (IC), which consists of a few to billions of active devices manufactured and interconnected on a single semiconductor body, the discrete semiconductor transistor 100 is a single transistor in the semiconductor body without any other active semiconductor elements interconnected thereto. Although passive components such as resistors, capacitors and inductors may be formed in and/or on the semiconductor body, the discrete semiconductor transistor 100 is specified to perform an elementary electronic function. Although the discrete semiconductor transistor 100 may include a large number of transistor cells, the discrete semiconductor transistor 100 is specified to perform an elementary electronic function and is not divisible into separate components functional in themselves as is typical for integrated circuits.

The gate terminal may be a gate contact area such as a gate pad configured to act as a bond pad. The gate electrode may comprise a conductive material, for example doped polycrystalline silicon abutting a gate dielectric. The gate resistor 105 may include all or part of resistive elements between the gate terminal and the gate electrode. By way of example, the gate resistor 105 may be determined by contact probes and/or extracted from measurement of an electric characteristic such as a quality factor, for example.

According to an embodiment, a temperature coefficient α1 of the resistance R satisfies $$\frac{R(0° \text{ C.}) - R(100° \text{ C.})}{R(0° \text{ C.})} = -\alpha_1 \times 100 \text{ K},$$

α1<−0.001 1/K.

According to another embodiment, the temperature coefficient α1 satisfies −0.01 1/K<α1<−0.001 1/K.

According to an embodiment, the discrete semiconductor transistor 100 is a FET such as a MOSFET having drain and source as first and second load terminals 112, 113. According to another embodiment, the discrete semiconductor transistor 100 is an IGBT having collector and emitter as first and second load terminals 112, 113. According to yet another embodiment, the discrete semiconductor transistor 100 is a JFET having drain and source as first and second load terminals 112, 113.

The semiconductor body of the discrete semiconductor transistor 100 may be provided from a single crystalline semiconductor material, for example silicon (Si), silicon carbide (SiC), germanium (Ge), silicon germanium (SiGe), gallium nitride (GaN) or gallium arsenide (GaAs) by way of example.

According to an embodiment, the discrete semiconductor transistor 100 is electrically interconnected with other, for example similar, discrete semiconductor transistors in a semiconductor module.

By coupling the gate resistor 105 having a negative temperature coefficient between the gate terminal 110 and the gate electrode terminal 111, a temperature characteristic of an overvoltage during transistor turn-off can be adjusted in a beneficial way. Furthermore, reduction of the resistance with increasing temperature is beneficial with regard to switching losses.

Figure 2A:
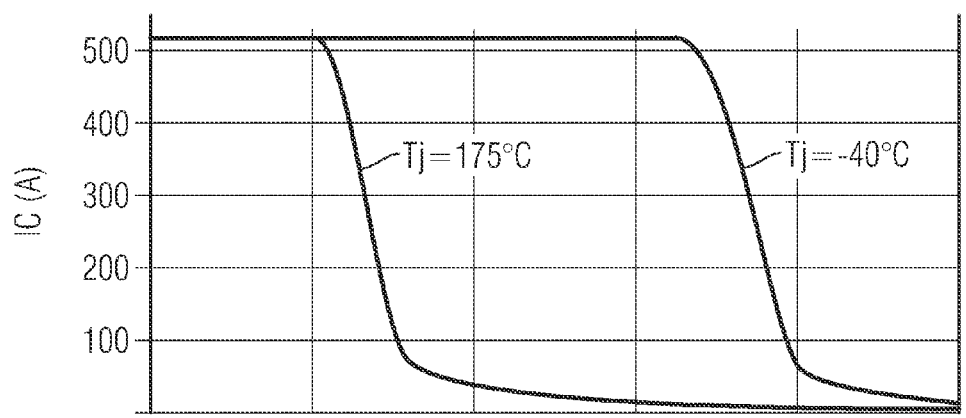
FIGS. 2A and 2B are graphs schematically illustrating characteristics of collector current Ic and collector-emitter overvoltage VCE versus time during IGBT turn-off according to an embodiment.
Figure 2B:
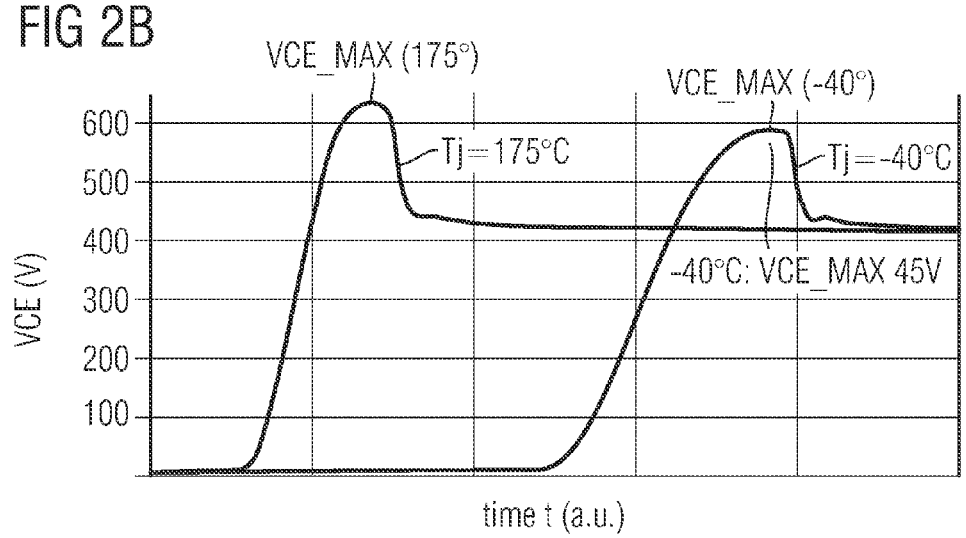

A temperature characteristic of an overvoltage during transistor turn-off can be determined by respective measurements. By way of example, FIG. 2A illustrates a collector current characteristic via time for an IGBT at different temperatures Tj=−40° C. and Tj=175° C. Referring to the graph illustrated in FIG. 2B, a characteristic of an overvoltage VCE between collector and emitter versus time during transistor turn-off is illustrated for the IGBT of FIG. 2A at the same transistor temperatures Tj=−40° C. and Tj=175° C. As can be derived from the curves at Tj=−40° C. and Tj=175° C., a maximum overvoltage VCE_MAX is larger at Tj=175° C. than at Tj=−40° C. (see VCE_MAX(175° C.) and VCE_MAX(−40° C.)).

Figure 2C:
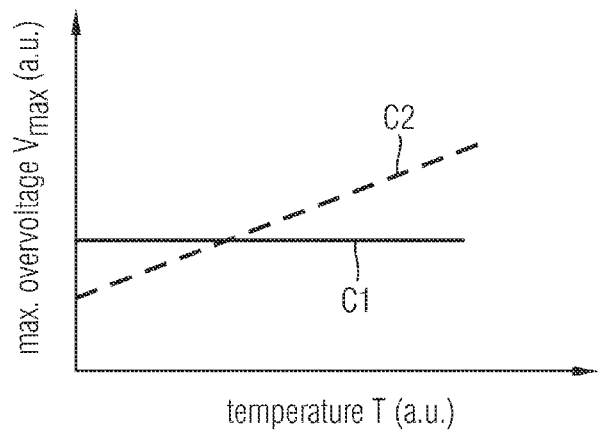
FIG. 2C is a graph illustrating a maximum overvoltage Vmax during transistor turn-off versus a temperature T according to embodiments.

In the schematic graph of FIG. 2C, a maximum overvoltage Vmax during transistor turn-off versus temperature T is schematically illustrated according to embodiments. The maximum overvoltage Vmax at a specific temperature corresponds to a peak in the characteristic of overvoltage during transistor turn-off such as VCE_MAX at T=−40° C. and T=175° C. illustrated in FIG. 2B for the example of an IGBT. In the embodiment illustrated as curve C1, a temperature coefficient of the maximum overvoltage Vmax is 0 resulting in a temperature-independent maximum overvoltage Vmax. In the embodiment illustrated by curve C2, a temperature coefficient of the maximum overvoltage Vmax is positive resulting in an increase of maximum overvoltage Vmax with increasing temperature T. Apart from the embodiments illustrated by curves C1 and C2 in FIG. 2C, other characteristic curves may be achieved by adjusting the negative temperature coefficient of the gate resistor and a temperature profile thereof.

Figure 3:
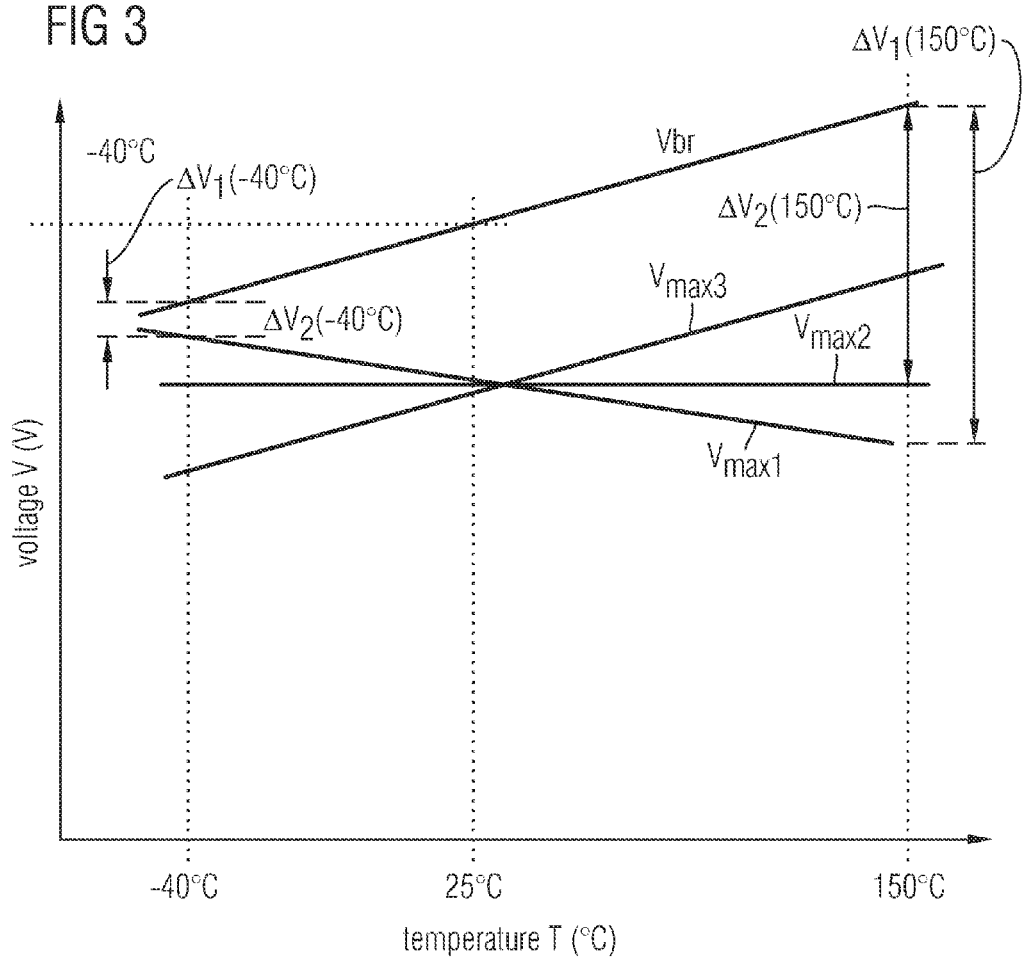
FIG. 3 is a graph illustrating voltage margins ΔV between an electric breakdown voltage Vbr and the overvoltage Vmax versus a temperature T.

The discrete semiconductor transistor 100 comprising the gate resistor 105 having a negative temperature coefficient allows for an improved voltage margin between the specified breakdown voltage Vbr and maximum overvoltages Vmax during turn-off operation as is illustrated and described with respect to the graph of FIG. 3.

Referring to FIG. 3, voltage curves are illustrated versus a temperature T. The voltage curve denoted Vbr refers to an electric breakdown voltage characteristic of a discrete semiconductor transistor. Overvoltage Vmax1 refers to a discrete semiconductor transistor with a gate resistor having a typical positive temperature coefficient. The gate resistor having a positive temperature coefficient may be a gate resistor made of a highly doped semiconductor material such as highly p-doped polycrystalline or single-crystalline silicon or highly n-doped polycrystalline or single-crystalline silicon, for example. The overvoltage Vmax1 of the discrete semiconductor transistor having the gate resistor with positive temperature coefficient decreases with increasing temperature T. Thus, a temperature coefficient of the overvoltage Vmax1 is negative which is contrary to the positive temperature coefficient of the electric breakdown voltage Vbr. The temperature coefficients of the electric breakdown voltage Vbr and the overvoltage Vmax1 having an opposite sign result in an unfavorable temperature behavior of a voltage margin ΔV1 between the electric breakdown voltage Vbr and the overvoltage Vmax1. Although the voltage margin ΔV1 at a temperature of 150° C. is large enough for operating the discrete semiconductor transistor in a safe operating area (see ΔV1(150° C.)), the voltage margin ΔV1 sharply decreases with decreasing temperature T (see ΔV1 (−40° C.)) and may even be smaller than a minimum safety margin for compensating variations of the electric breakdown voltage Vbr and the overvoltage Vmax1 caused by process technology fluctuations, e.g. fluctuations across a processed wafer, fluctuations between wafers processed in parallel or subsequent to each other, fluctuations of specific processes such as fluctuations of front end of line (FEOL) processes. By way of example, the voltage margin ΔV1 at the temperature T=−40° C. should be larger than a sum of $3 \times \sigma_{BR}$ and $3 \times \sigma_{max}$ for safe operation, $\sigma_{BR}$ being a standard deviation from an average breakdown voltage and $\sigma_{max}$ being a standard deviation from an average maximum overvoltage at T=−40° C.

Overvoltage Vmax2 refers to a discrete semiconductor transistor with a gate resistor having a negative temperature coefficient according to an embodiment. Similar to voltage curve C1 illustrated in FIG. 2C, the overvoltage Vmax2 is constant in the illustrated temperature range. Although a voltage margin ΔV2 between the electric breakdown voltage Vbr and the overvoltage Vmax2 at a temperature of 150° C. (see ΔV2(150° C.)) is smaller than ΔV1(150° C.), the voltage margin ΔV2 at the temperature T=150° C. is also large enough for operating the discrete semiconductor transistor in a safe operating area. However, since the overvoltage Vmax2 is constant over the illustrated temperature range and does not increase with decreasing temperature as the overvoltage Vmax1 of a typical gate resistor having a positive temperature coefficient, the voltage margin ΔV2 at the temperature T=−40° C. is more favorable than the voltage margin ΔV1 at the same temperature T=−40° C., because ΔV2(−40° C.)>ΔV1(−40° C.). Thus, safety of operating the discrete semiconductor transistor at the temperature T=−40° C. can be improved by counteracting or avoiding an undesired electric breakdown caused by an overvoltage during transistor turn-off.

Overvoltage Vmax3 refers to another embodiment of a discrete semiconductor transistor with a gate resistor having a negative temperature coefficient. Similar to voltage curve C2 illustrated in FIG. 2C, the overvoltage Vmax3 increases with increasing temperature in the illustrated temperature range. Although a voltage margin ΔV3 between the electric breakdown voltage Vbr and the overvoltage Vmax3 at a temperature of 150° C. (see ΔV3(150° C.)) is smaller than ΔV1 (150° C.) and ΔV2(150° C.), the voltage margin ΔV3 at the temperature T=150° C. is also large enough for operating the discrete semiconductor transistor in a safe operating area. However, since the overvoltage Vmax3 decreases with decreasing temperature T over the illustrated temperature range similar as Vbr and does not increase with decreasing temperature as the overvoltage Vmax1 of a typical gate resistor having a positive temperature coefficient, the voltage margin ΔV3 at the temperature T=−40° C. is more favorable than the voltage margins ΔV1 and ΔV2 at the same temperature T=−40° C., because ΔV3(−40° C.)>ΔV2(−40° C.)>ΔV1(−40° C.). The voltage margin ΔV3 may even be constant over the illustrated temperature range. Thus, safety of operating the discrete semiconductor transistor at the temperature T=−40° C. can be improved by counteracting or avoiding an undesired electric breakdown caused by an overvoltage during transistor turn-off.

Thus, embodiments of the discrete semiconductor transistor comprising a gate resistor having a negative temperature coefficient allow for an improved voltage margin between the electric breakdown voltage Vbr and the maximum overvoltage Vmax during transistor turn-off. Switching losses may be decreased with increasing temperature compared to discrete semiconductor transistors having a gate resistor with a positive temperatures coefficient.

According to an embodiment, the resistance R of the gate resistor 105 is in a range from 0.5Ω to 50Ω at a transistor temperature of Tj=25° C.

Figure 4:
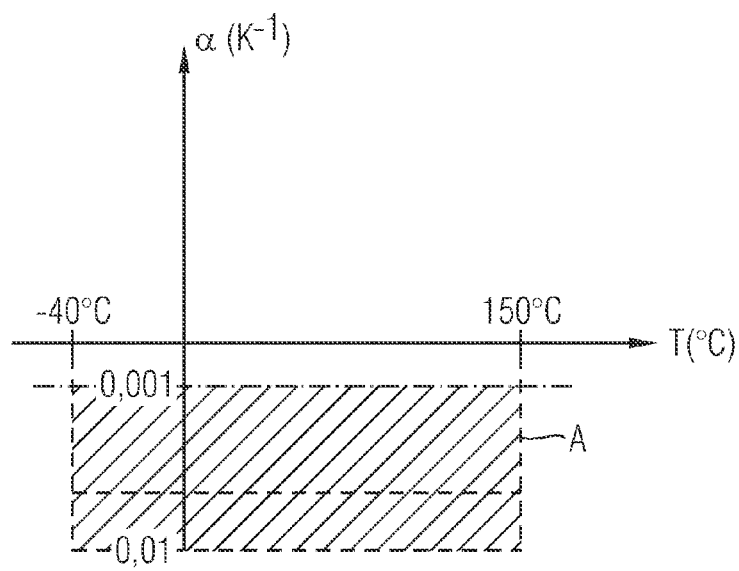
FIG. 4 is a graph illustrating a range of a temperature coefficient range α of a gate resistor versus a temperature T according to an embodiment.

FIG. 4 is a graph illustrating one embodiment of the temperature coefficient α of the gate resistor 105 versus temperature T. According to an embodiment, the temperature coefficient α ranges from −0.01 1/K to −0.001 1/K in a temperature range from −40° C. to 150° C. (see hedged area denoted A in FIG. 4).

According to an embodiment, the gate resistor 105 is a crystalline silicon gate resistor, for example a single-crystalline or polycrystalline silicon gate resistor, wherein a doping concentration of the gate resistor includes at least 50% deep-level dopants. A deep-level dopant is a dopant in the sense that energy required to remove an electron or hole from the dopant to the valence or conduction band is larger than four times the characteristic thermal energy kT, where k is the Boltzmann constant and T is the temperature. Whereas boron (B), aluminum (Al) or gallium (Ga) are examples of flat-level acceptors in silicon and phosphorus (P), arsenic (As), antimony (Sb) are examples for flat-level donors in silicon, one embodiment of the gate resistor 105 includes at least one of selenium (Se), sulfur (S), indium (In) as a deep-level dopant. By doping the gate resistor with at least 30%, or even 50% or 70% deep-level dopants, a negative temperature coefficient may be achieved due to the fact that at temperatures above room temperature a substantial amount of electrons/holes are transferred from a deep-level donor/acceptor to the conduction band/valence band. A characteristic of the maximum overvoltage Vmax during transistor turn-off can be set as desired by adjusting concentrations of flat- and deep-level dopants relative to each other in consideration of their activation energies.

According to an embodiment, the gate resistor 105 is a crystalline silicon gate resistor, for example a single-crystalline or polycrystalline silicon gate resistor and a conductivity type of the crystalline silicon is an n-type. An n-type doping concentration of the crystalline silicon gate resistor is less than $10^{18}$ cm$^{-3}$. Thereby, a Schottky barrier exists between the crystalline silicon gate resistor and a contact on the crystalline silicon gate resistor. Current flow through the Schottky barrier increases with increasing temperature since an increase of the temperature facilitates an overcome of the Schottky barrier by electrons.

According to an embodiment, the gate resistor 105 is a crystalline silicon gate resistor, for example a single-crystalline or polycrystalline silicon gate resistor and a conductivity type of the polycrystalline silicon is a p-type. A p-type doping concentration of the crystalline silicon gate resistor is less than $10^{16}$ cm$^{-3}$. Thereby, a Schottky barrier exists between the crystalline silicon gate resistor and a contact on the crystalline silicon gate resistor. Current flow through the Schottky barrier increases with increasing temperature since an increase of the temperature facilitates an overcome of the Schottky barrier by holes. If the doping level of the crystalline silicon gate resistor is less than $10^{13}$ cm$^{-3}$, the resistivity of the silicon exhibits a significant negative temperature coefficient due to temperature-induced generation of free charge carriers.

Figure 5:
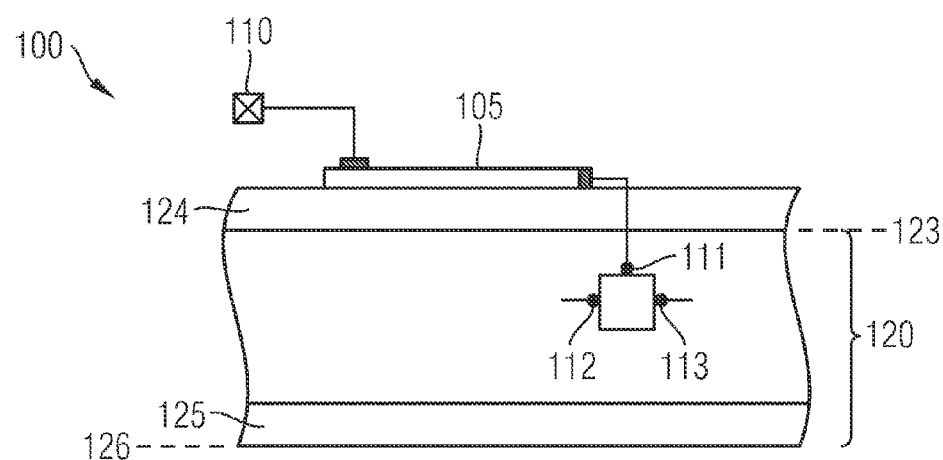
FIG. 5 is a schematic cross-sectional view illustrating a gate resistor in a wiring area above a semiconductor body.

Referring to the schematic cross-sectional view of FIG. 5, an embodiment of the discrete semiconductor transistor 100 comprises a semiconductor body 120 and a wiring area on the semiconductor body 120 at a first side 123. In the embodiment illustrated in FIG. 5, the wiring area includes one or more patterned or unpatterned metallization and/or doped semiconductor layers for providing an electric connection from each one of the gate electrode terminal 111 and the first and second load terminals 112, 113 to transistor pads or pins, e.g. the gate terminal 110. The wiring area also comprises the gate resistor 105.

In the embodiment illustrated in FIG. 5, the gate resistor 105 is a planar gate resistor and an insulating layer 124, e.g. an oxide layer, is arranged between the gate resistor 105 and the semiconductor body 120. According to other embodiments, the gate resistor 105 or part of the gate resistor 105 may also be formed in one or more trenches in the semiconductor body 120. The semiconductor resistor may also be formed as one more doped semiconductor region(s) in the semiconductor body 120, for example.

In FIG. 5, an illustration of the discrete semiconductor transistor 100 in the cross-sectional view is simplified by replacing constituent elements such as transistor semiconductor well(s) and transistor dielectric(s) by a box surrounded by the gate electrode terminal 111 and the first and second load terminals 112, 113.

A thickness of the semiconductor body 120 may range from tens of µm to hundreds of µm depending upon voltage blocking requirements of the discrete semiconductor transistor 100.

The discrete semiconductor transistor 100 may include an optional field stop zone 125, e.g. at a second side 126 of the semiconductor body 120. According to an embodiment, the gate resistor 105 and the field stop zone 125 each comprise a same type of deep-level dopants such as selenium, whereby a deep level doping of the field stop zone enhances positive temperature dependence of the overvoltage during turn-off because the temperature-induced increase of the doping level of the field stop zone results in a decrease of the hole injection by a rear side emitter of IGBTs.

According to another embodiment of the discrete semiconductor transistor, the gate resistor 105 is a negative temperature coefficient thermistor.

Figure 6:
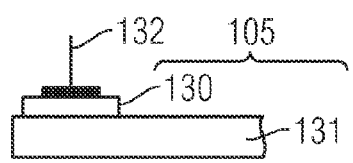
FIG. 6 is a schematic cross-sectional view illustrating a gate resistor including a tunnel dielectric adjoining an electric contact.

A further embodiment is illustrated in the schematic cross sectional view of FIG. 6. A tunnel dielectric 130 is part of the gate resistor 105 which further includes a conductive part 131 comprising highly doped semiconductor material(s) and/or metal(s), for example. The tunnel dielectric 130 is arranged between a contact 132 to the gate resistor 105 and the conductive part 131. Current flow through the tunnel dielectric 130 increases with increasing temperature since an increase of the temperature facilitates tunneling of charge carriers through the tunnel dielectric 130 leading to a negative temperature coefficient of the gate resistor 105. According to an embodiment, the gate resistor 105 includes a plurality of tunnel dielectrics connected in parallel.

Figure 7:
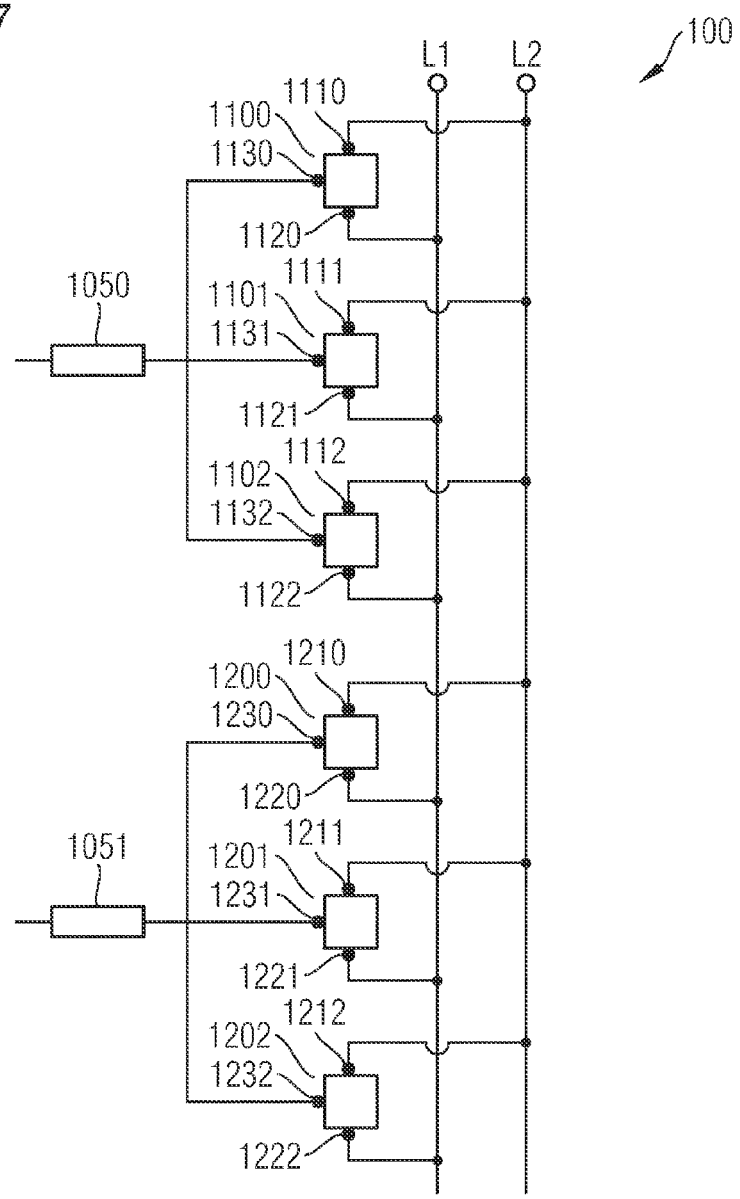
FIG. 7 is a schematic illustration of a parallel connection of gate sub-resistors electrically coupled to gate electrodes of different groups of transistor cells.

In another embodiment of the discrete semiconductor transistor 100 illustrated in FIG. 7, the gate resistor 105 is a parallel connection of a plurality of gate sub-resistors such as sub-gate resistors 1050, 1051. Each gate sub-resistor is electrically coupled to a different group of transistor cells of the discrete semiconductor transistor 100. The gate sub-resistor 1050 is electrically coupled to gate electrode terminals 1130, 1131, 1132 of a first group of transistor cells 1100, 1101, 1102 and the gate sub-resistor 1051 is electrically coupled to gate electrode terminals 1230, 1231, 1232 of a second group of transistor cells 1200, 1201, 1202. First load terminals 1110, 1111, 1112 of the first group and first load terminals 1210, 1211, 1212 of the second group are connected to a same first load terminal pin L2. Second load terminals 1120, 1121, 1122 of the first group and second load terminals 1220, 1221, 1222 of the second group are connected to a same second load terminal pin L1.

In the embodiment illustrated in FIG. 7, two gate sub-resistors are illustrated, each gate sub-resistor being electrically coupled to three transistor cells. The number of gate sub-resistors and the number of transistor cells electrically coupled to one gate sub-resistor may of course vary depending upon transistor design.

By sub-dividing the transistor cells into groups and driving gates of the transistors cells of the groups by different gate sub-resistors, undesired hot-spot generation during transistor operation may be counteracted or avoided since a decrease of the gate sub-resistor with increasing temperature leads to a reduction of switching losses of the group of transistor cells driven via the respective gate sub-resistor.

According to another embodiment, an inhomogeneous temperature distribution across a chip area may be counteracted by setting a resistance of at least two of the gate sub-resistors to different values. By way of example, a temperature at a chip edge may be smaller than at a chip center. By setting a gate sub-resistor for driving transistor cells in the chip center to smaller values than the gate sub-resistor for driving transistor cells in the chip edge, uniformity of the temperature distribution may be improved.

Figure 8:
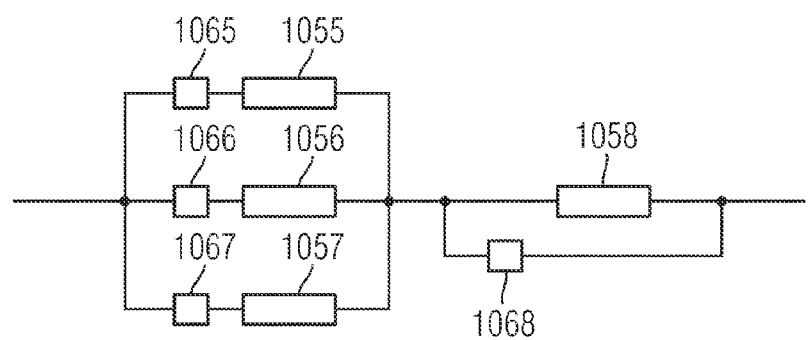
FIG. 8 illustrates one embodiment of a gate resistor comprising an interconnection of gate sub-resistors determined by fuses.

In another embodiment of the discrete semiconductor transistor 100 illustrated in FIG. 8, the gate resistor 105 comprises a plurality of gate sub-resistors 1055, 1056, 1057, 1058 that may be partly connected in parallel such as sub-resistors 1055, 1056, 1057 and partly be connected in series. An interconnection between the gate sub-resistors 1055, 1056, 1057, 1058 is determined by a plurality of fuses 1065, 1066, 1067, 1068. By way of example, each one of the fuses 1065, 1066, 1067, 1068 may be blown by laser trimming, for example. A short-circuit between opposite ends of the gate sub-resistor 1058 may be removed by blowing the fuse 1068, thereby connecting the gate sub-resistor 1058 in series with one or more of the gate sub-resistors 1055, 1056, 1057. Likewise, a parallel connection of the gate sub-resistors 1055, 1056, 1057 may be adjusted by blowing none, one or two of the fuses 1065, 1066, 1067. The variable interconnection of gate sub-resistors allows for a flexible adjustment of gate resistance. According to an embodiment, at least two of the plurality of gate sub-resistors have different temperature coefficients. Thereby, a temperature coefficient of the gate resistor 105 may be adjusted in a desired and flexible way.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, the semiconductor regions denoted p-doped or n-doped in the illustrated embodiments may also be doped vice versa, i.e. the semiconductor regions denoted p-doped may be n-doped and the semiconductor regions denoted n-doped may be p-doped. This application is intended to cover any adaptations or variations of the specific embodiments discussed herein. Therefore, it is intended that this invention be limited only by the claims and the equivalents thereof.

What is claimed is:

1. A discrete semiconductor transistor, comprising:
    transistor cells in a single semiconductor body, each of the transistor cells comprising a gate electrode terminal, a first load terminal and a second load terminal, wherein the gate electrode terminals of the transistor cells are electrically connected, the first load terminals of the transistor cells are electrically connected and the second load terminals of the transistor cells are electrically connected;
    a gate resistor electrically coupled between a gate terminal and the gate electrode terminals of the transistor cells; wherein
    a resistance R of the gate resistor at a temperature of 25° C. is greater than at the temperature of 150° C., and
    wherein the gate resistor is a is a parallel connection of a plurality of gate sub-resistors, each gate sub-resistor being electrically coupled to a different group of the transistor cells of the discrete semiconductor transistor.

2. The discrete semiconductor transistor of claim 1, wherein a temperature coefficient α1 of the resistance R satisfies:

$$\frac{R(0° C.) - R(100° C.)}{R(0° C.)} = -\alpha_1 \times 100 \, K,$$

wherein the temperature coefficient α1 ranges from −0.01 1/K<α1<−0.001 1/K.

3. The discrete semiconductor transistor of claim 1, wherein the resistance R of the gate resistor is in a range from 0.1Ω to 100Ω at a transistor temperature of Tj=25° C.

4. The discrete semiconductor transistor of claim 1, wherein the discrete semiconductor transistor is a power transistor, the power transistor being one selected from the group consisting of an insulated gate bipolar transistor, a field effect transistor, and a junction field effect transistor.

5. The discrete semiconductor transistor of claim 1, wherein the gate resistor is a crystalline silicon gate resistor.

6. The discrete semiconductor transistor of claim 5, wherein a doping concentration of the gate resistor includes at least 50% deep-level dopants.

7. The discrete semiconductor transistor of claim 6, wherein the deep-level dopants include at least one selected from the group consisting of selenium, sulfur, and indium.

8. The discrete semiconductor transistor of claim 7, wherein a conductivity type of the crystalline silicon gate resistor is n-type and an n-type doping concentration of the crystalline silicon gate resistor is less than $10^{18}$ cm$^{-3}$.

9. The discrete semiconductor transistor of claim 7, wherein a conductivity type of the crystalline silicon gate resistor is p-type and a p-type doping concentration of the crystalline silicon gate resistor is less than $10^{16}$ cm$^{-3}$.

10. The discrete semiconductor transistor of claim 7, wherein a conductivity type of the crystalline silicon gate resistor is p-type and a p-type doping concentration of the crystalline silicon gate resistor is less than $10^{13}$ cm$^{-3}$.

11. The discrete semiconductor transistor of claim 5, further comprising a tunnel dielectric as part of the crystalline silicon gate resistor.

12. The discrete semiconductor transistor of claim 1, wherein the gate resistor is a negative temperature coefficient thermistor.

13. The discrete semiconductor transistor of claim 1, wherein the gate resistor and a field stop zone of the discrete semiconductor transistor each comprise selenium dopants.

14. The discrete semiconductor transistor of claim 1, wherein a resistance of at least two of the gate sub-resistors is different.

15. The discrete semiconductor transistor of claim 1, further comprising a field stop zone defined by deep-level dopants.

16. A semiconductor module comprising a plurality of interconnected discrete semiconductor chips and the discrete semiconductor transistor according to claim 1.

* * * * *

UNITED STATES PATENT AND TRADEMARK OFFICE
CERTIFICATE OF CORRECTION

PATENT NO.        : 9,871,126 B2
APPLICATION NO.   : 14/305596
DATED             : January 16, 2018
INVENTOR(S)       : A. Kiep et al.

It is certified that error appears in the above-identified patent and that said Letters Patent is hereby corrected as shown below:

In the Claims

Column 1, Line 21 (Claim 1, Line 15) please change "resistor is a is a" to -- resistor is a --

Signed and Sealed this
Third Day of April, 2018

Andrei Iancu
*Director of the United States Patent and Trademark Office*